Feb. 7, 1967 S. NOREN ETAL 3,303,265

MINIATURE SEMICONDUCTOR ENCLOSURE

Original Filed May 17, 1962

SAUL NOREN
ROBERT C. ROBINSON
INVENTORS

BY James O. Dixon
ATTORNEY

United States Patent Office
3,303,265
Patented Feb. 7, 1967

3,303,265

MINIATURE SEMICONDUCTOR ENCLOSURE

Saul Noren, Richardson, and Robert C. Robinson, Dallas, Tex., assignors to Texas Instruments Incorporated, Dallas, Tex., a corporation of Delaware Continuation of application Ser. No. 195,450, May 17, 1962. This application June 21, 1965, Ser. No. 465,508
5 Claims. (Cl. 174—52)

This application is a continuation of our copending application, Serial No. 195,450, filed May 17, 1962, now abandoned. The present invention relates to semiconductor devices, and more particularly to header mounting bases and enclosures therefor.

The increasing demand for miniature electrical components has prompted the development of several types of miniature semiconductor device packages. Some of these are merely reduced size versions of standard glass-to-metal packages, while others incorporate special sealing techniques. Many packages use a solder seal which restricts use in high temperature environments and places the upper temperature limit on the package rather than on the active elements of the device.

It is therefore an object of this invention to provide a welded miniature hermetically sealed device which has an upper temperature limit imposed thereon by the active elements of the device rather than by the package.

Another object of the invention is a semiconductor device of minimal dimensions and of a configuration which allows flexibility in circuit design. Thus the device may be used in the conventional manner on circuit boards or in a variety of ways that allows for maximum space utilization.

Other objects and features of the invention will be apparent from the following detailed description, taken in conjunction with the appended claims and the attached drawing, in which:

In accordance with the invention, an improved semiconductor device container is fabricated by taking a thin circular ceramic disc and locating three holes therein on a concentric circle with two of the holes preferably in substantial alignment with respect to the center of the disc. A metal film is deposited on each side of the disc in a particular design, which fills the three holes and enables electrical contact to be made with the active areas of the semiconductor element within the container from metal tabs atatched to the opposite side of the disc. On the side of the disc on which the semiconductor element is to be mounted, a metal ring or eyelet is secured to a complementary metallized surface deposited on the disc at the outer periphery thereof. This eyelet serves as a flange to which a metal disc may be resistance-welded after the semiconductor element has been mounted to one of the strips of metal film.

Figure 1:
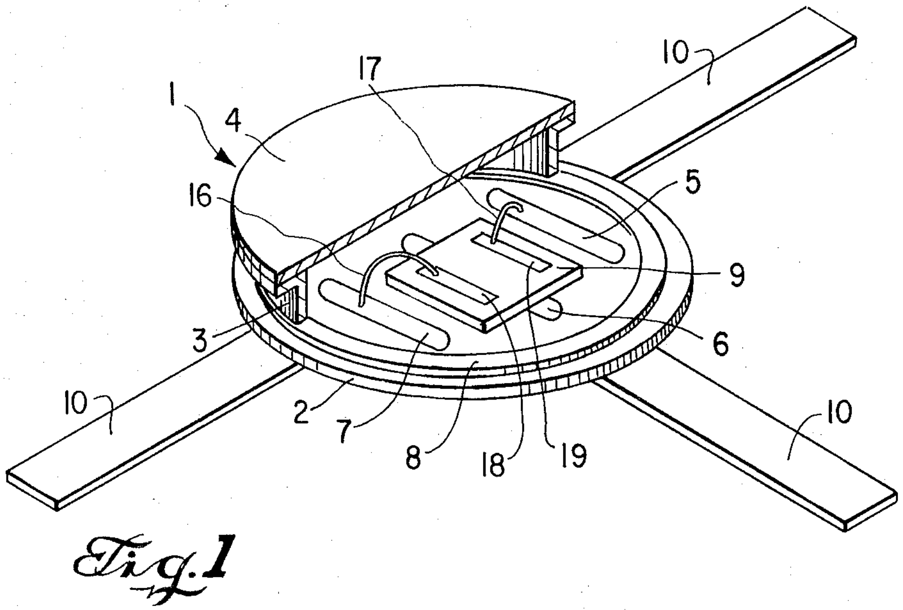
FIGURE 1 is a pictorial view of the semiconductor package of the invention with part of the package removed to show the interior construction thereof and the mounting of the semiconductor device therein.
Figure 2:
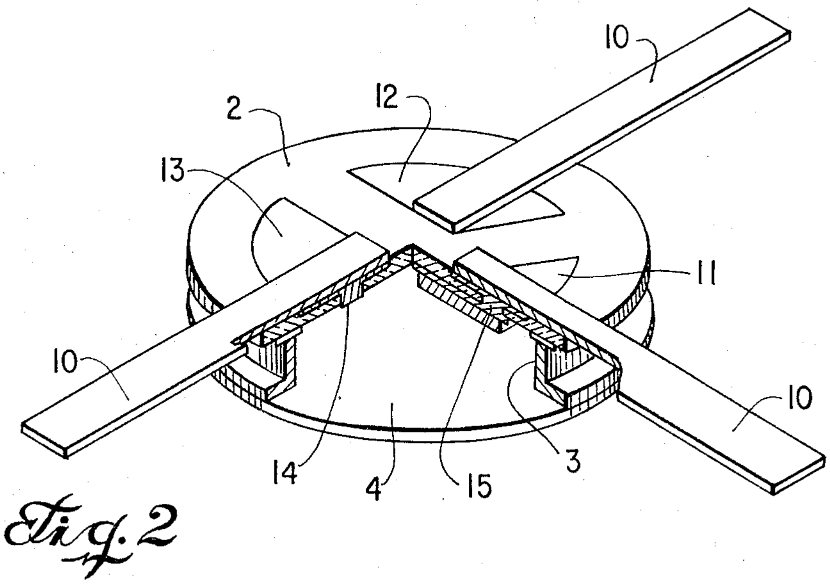
FIGURE 2 is a pictorial representation of the bottom of the package with a section removed to show another view of the interior construction.

Referring now to FIGURES 1 and 2, there is shown a welded miniature, hermetically sealed transistor package 1. It comprises a thin circular ceramic disc 2, preferably of alumina or beryllia ceramic, but any other material having equally suitable properties will be satisfactory. A metallic film is deposited on both sides of the ceramic disc 2 in a pattern of three parallel strips 5, 6 and 7, a ring 8 on one side (as shown in FIGURE 1) and three pie-shaped sections 11, 12 and 13 on the other side. The metallic pattern is applied by the well known "silk-screen" process and is fired to form a hermetic bond between the applied metal film (which may be molybdenum-manganese, for example) and the ceramic disc. A unique feature in applying the metallization results in metallization through the three holes in the ceramic disc, two of which, 14 and 15, are shown in FIGURE 2. The metallization causes the holes to be filled by a pressure differential maintained on either side of the disc. The pressure differential causes the molybdenum-manganese material to flow into and through the holes as the material is applied. It is the metal through the holes which allows electrical contact to be made from one side of the wafer to the other.

Metal strip 5 connects electrically to section 13 through hole 14; metal strip 6 connects electrically to section 11 through hole 15, and metal strip 7 connects electrically to section 12 through a hole not shown. The metallized ring 8 surrounds the strips 5, 6 and 7 and lies on the periphery of the disc. The metallic pattern is completed by plating the fired molybdenum-manganese layer with a suitable material, nickel or copper for example, and then sintering.

The ceramic body, with the nickel plated metallized pattern thereon, is placed in a graphite assembly boat (not shown) along with suitable brazing preforms, lead tabs 10 and weld ring 3. One each of the lead tabs 10 is positioned next to one of the sections 11, 12 or 13, and weld ring 3 is positioned over the metallic ring 8. The boat is fired in an inert or reducing atmosphere to a suitable brazing temperature, which is slowly raised and then lowered after reaching brazing temperature to prevent too fast a temperature change that might cause the ceramic disc 2 to crack in consequence of different thermal coefficients of expansion. During the brazing, weld ring 3 is joined to the ceramic disc 2 at ring pattern 8, resulting in a hermetic bond therebetween. Lead tabs 10 are secured, one each to one of the sections 11, 12 and 13. Suitable material for lead tabs 10 and weld ring 3 might be Kovar as it presents a good thermal match to the ceramic, although nickel may be used successfully. Any suitable brazing material may be used, for example copper-silver eutectic alloy, a copper-gold alloy or pure copper.

The metal surfaces are then nickel and gold plated and the package is ready to receive the transistor.

As illustrated in FIGURE 1, the transistor wafer 9 is mounted on a portion of strip 6 and makes ohmic contact therewith. A lead 16 is attached to a region 18 on the transistor wafer and to strip 7; a second lead 17 is attached to a region 19 of the transistor wafer and connects said region 19 to strip 5, each of said strips 5, 6 and 7 making an electrical contact with one of said lead tabs 10, each of said lead tabs 10 being electrically insulated from one another.

After the transistor has been connected to the strips 5, 6 and 7 and the latter are severally connected to the tabs 10 as described, a lid 4 is resistance-welded to weld ring 3 hermetically sealing and completing the package.

It is to be understood that the form of the invention, herein shown and described, is to be taken as a preferred example of the same, and that various changes in the shape, size and arrangement of the parts may be resorted to without departing from the spirit and scope of the invention as defined by the appended claims.

What is claimed is:

1. A hermetically sealed semiconductor device comprising: a ceramic plate with two faces, at least three holes in the plate transverse to said faces, metallized areas adjacent each hole on each of said faces and extending to and filling the holes, each of said metallized areas on one face of said plate electrically connected to one of said areas on the other face of said plate, a metallized area on one of said faces around the periphery of said plate with at metal ring attached to said metallized area, at least three flat ribbon-like conductive tags in a coplanar array with each tab being secured to a different one of the metallized areas on the other of said faces of said plate, said tabs extending beyond the periphery of said plate, a semiconductor wafer mounted on one of the metallized areas on said one face within said ring and electrically connected to at least one of the other metallized areas on said face, and a lid secured to said ring hermetically sealing said device.

2. A mounting base for a semiconductor device comprising; a ceramic body having two sides and holes therethrough, a metallic film deposited on each side of said ceramic body in at least two distinct regions and filling said holes, said metallic film in said holes electrically connecting separate regions of said metallic film on one side of said body with separate regions on the other side of said body, said region extending away from and covering an area greater than said holes, a weld ring mounted on and hermetically sealed onto one region of said metallic film, whereby a semiconductor may be mounted within and a lid attached to said weld ring.

3. A mounting base for a semiconductor device comprising: a ceramic disc having two major sides and holes therethrough, a metallic film deposited on each side of said disc in distinct regions and filling said holes, said film filling each hole with metal electrically connecting a portion of the film on one side of the disc with a portion of the film on the other side of the disc, said film covering an area greater than said holes, and flat ribbon-like leads disposed in substantially a coplanar array on said disc, each of said leads being conductively attached to a different part of said metallic film, and electrically insulated from each other and extending beyond the periphery of said ceramic disc.

4. A mounting base for a semiconductor device comprising; a ceramic disc having at least three holes therethrough, a metallic film deposited on one side of said disc in a pattern of four distinct configurations, a metallic film deposited on the other side of said disc in a pattern of three distinct configurations, each of said three distinct configurations on said other side being electrically connected to a portion of the pattern on said one side, a weld ring mounted on and secured to one of said four configurations for accommodating a sealing lid and surrounding an area on which a semiconductor device may be mounted, and three lead tabs disposed in a substantially coplanar array on the side of said disc having said three distinct configurations, one each of said three lead tabs being mounted on and secured to a different one of said three configurations, said leads extending beyond the periphery of said ceramic disc.

5. A container for sealing a semiconductor device therein comprising; a ceramic disc having three holes therein, said ceramic disc having a metallic film deposited in three distinct parts on one side thereof and in four distinct parts on the opposite side, each of said three distinct parts on said one side being electrically connected to a different one of the four distinct parts on said opposite side by portions of said metallic film extending through and filling each of said holes, a weld ring mounted on and secured to a fourth part of said four distinct parts of metallic film, a semiconductor wafer mounted on one of said four distinct parts surrounded by said weld ring and electrically connected to at least two of said distinct parts which are surrounded by said weld ring and closing said container.

References Cited by the Examiner

UNITED STATES PATENTS

| | | | |
|---|---|---|---|
| 2,971,138 | 2/1961 | Meisel et al. | 174—52 X |
| 3,072,832 | 1/1963 | Kilby. | |
| 3,105,868 | 10/1963 | Feigin et al. | 174—68.5 |
| 3,187,240 | 6/1965 | Clark | 174—50.5 X |

LEWIS H. MYERS, *Primary Examiner.*

DARRELL L. CLAY, *Examiner.*